United States Patent [19]
Keller

[11] 4,158,745
[45] Jun. 19, 1979

[54] LEAD FRAME HAVING INTEGRAL TERMINAL TABS

[75] Inventor: Joseph R. Keller, Harrisburg, Pa.

[73] Assignee: AMP Incorporated, Harrisburg, Pa.

[21] Appl. No.: 846,052

[22] Filed: Oct. 27, 1977

[51] Int. Cl.² .......................................... H01L 24/48
[52] U.S. Cl. ............................ 174/52 FP; 174/16 HS; 357/70; 361/421
[58] Field of Search ....................... 174/52 FP, 16 HS; 357/70; 361/421; 29/589; 113/119

[56] References Cited
U.S. PATENT DOCUMENTS

| | | | |
|---|---|---|---|
| 3,426,252 | 2/1969 | Lepselter | 357/69 |
| 3,544,857 | 12/1970 | Byrne et al. | 357/70 |
| 3,569,797 | 3/1971 | Simmons | 357/70 X |
| 3,597,666 | 8/1971 | Taskovich | 357/70 |
| 3,650,232 | 3/1972 | Heinlen | 174/52 FP X |
| 3,735,017 | 5/1973 | Manning | 174/52 FP |
| 3,736,367 | 5/1973 | Heinlen et al. | 174/52 FP |
| 3,778,887 | 12/1973 | Suzuki et al. | 29/588 |
| 3,821,615 | 6/1974 | Nordstrom | 357/70 |

OTHER PUBLICATIONS
General Electric Drawing, 118 C 8332.
General Electric Drawing, 138 B 8477.

Primary Examiner—Bruce A. Reynolds
Assistant Examiner—D. A. Tone
Attorney, Agent, or Firm—Frederick W. Raring

[57] ABSTRACT

A continuous strip of stamped and formed lead frames for a semi-conductor chip comprises a continuous carrier strip having three laterally extending arms integral therewith. One of the arms has a chip receiving surface to which the chip is soldered. The other arms have reversely bent end portions which extend over the chip receiving surface and which are intended to be connected to contact areas on the upwardly facing surface of the chip. Each of the arms has an integral terminal member extending therefrom in the plane of the strip and these terminal members are later bent upwardly relative to the plane of the strip so that they surround the chip receiving surface. The terminal members may comprise rectangular tabs formed by folding the stock metal of the strip and dimensioned to receive complementary contact terminals on the ends of wires thereby to connect the contact areas of the chip to external circuitry.

13 Claims, 7 Drawing Figures

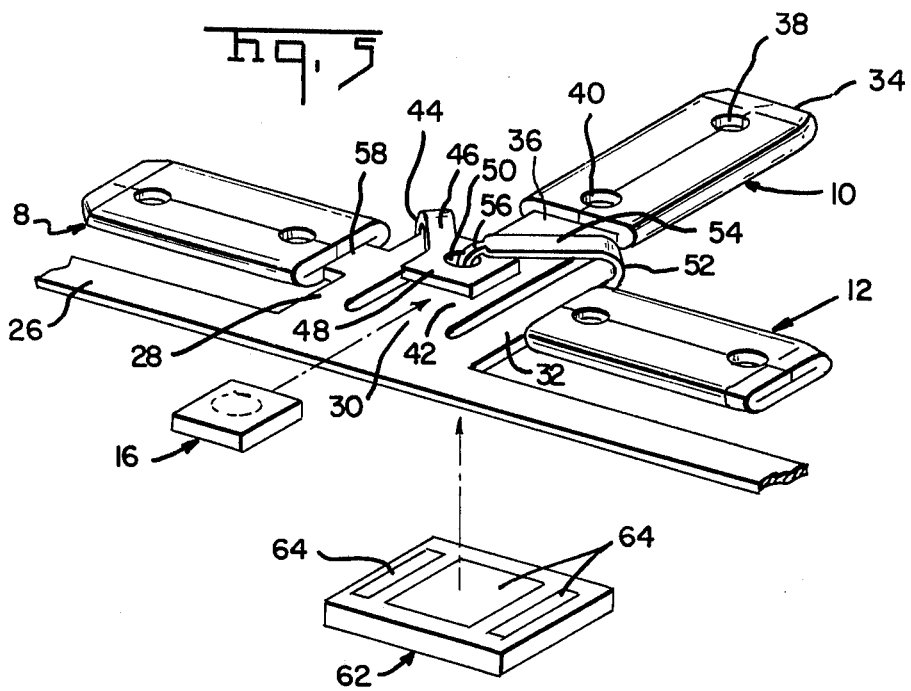
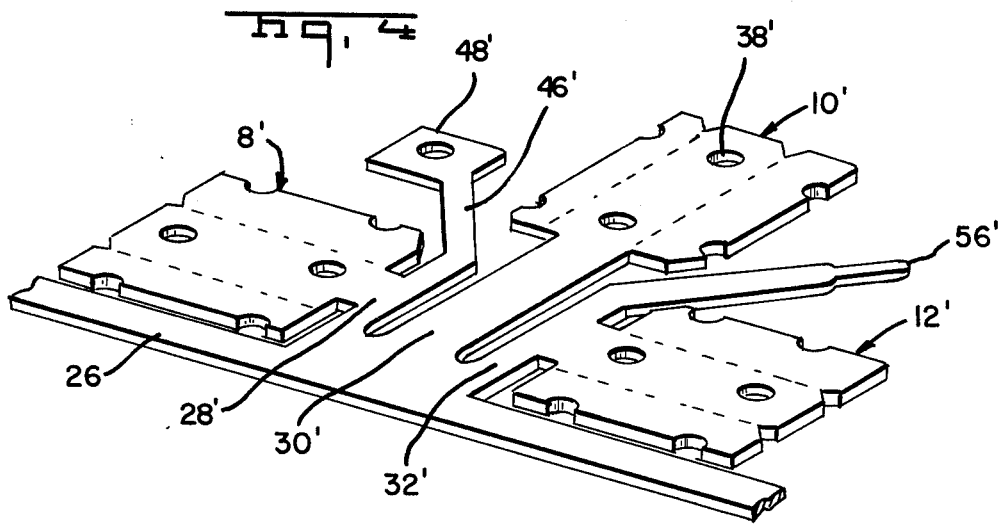

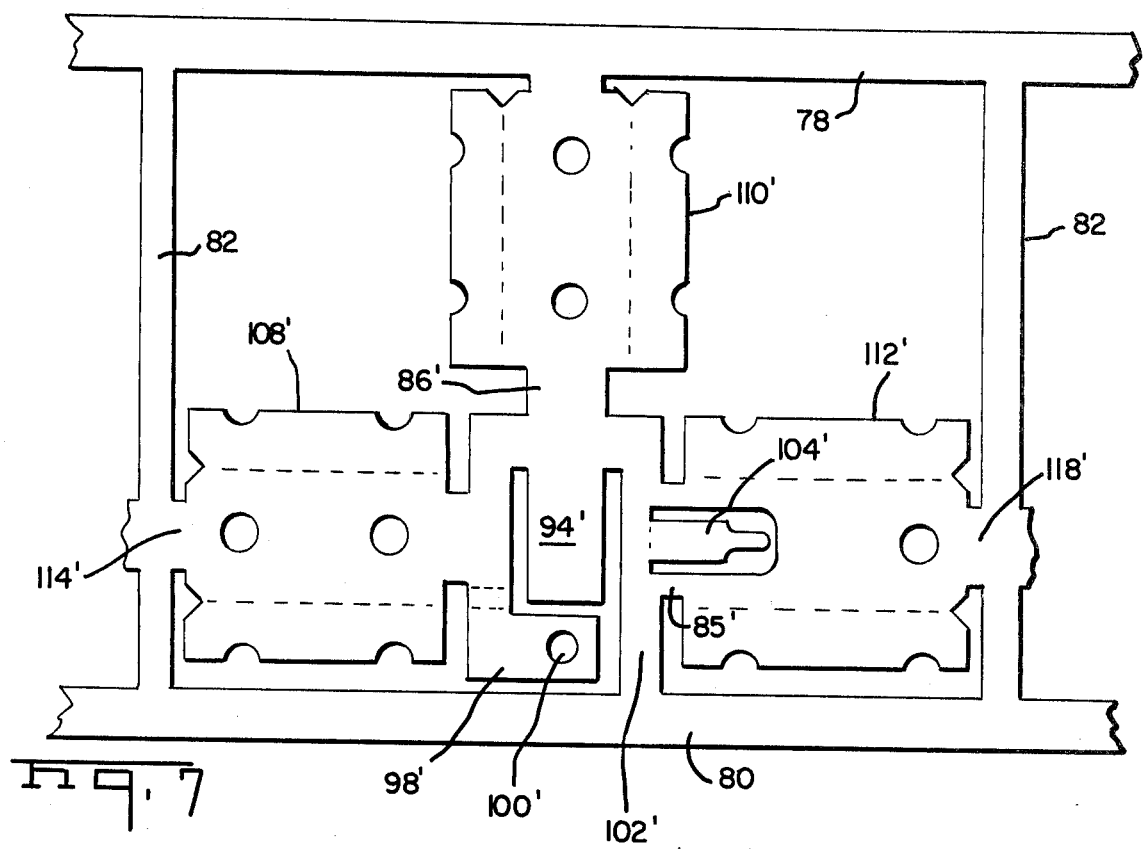
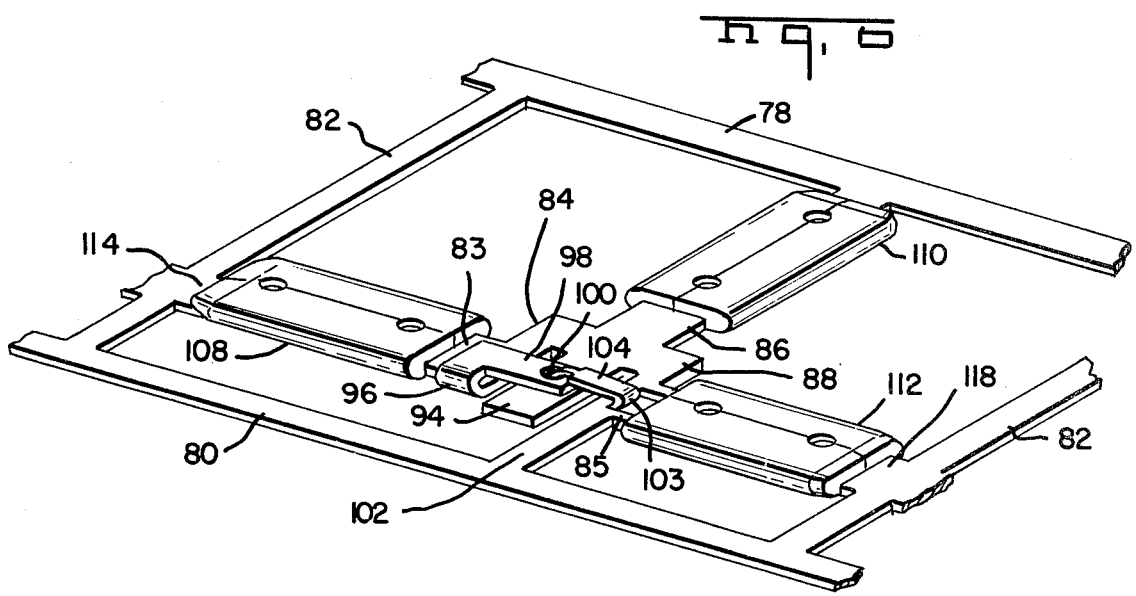

LEAD FRAME HAVING INTEGRAL TERMINAL TABS

BACKGROUND OF THE INVENTION

This invention relates to lead frames for packaging solid state chips such as triacs or transistors and to packaged chips having integral terminal members connected to the chips for making external connections.

Solid state devices such as transistors and triacs are commonly incorporated into electrical circuits by connecting the contact areas of the chip to sheet metal stamped and formed leads in a lead frame which, in turn, have portions which can be connected to external circuitry. The sheet metal lead frames are produced in endless strip form. The final package for the chip is thus produced by mounting the chip on a chip receiving portion of the lead frame, connecting conductors of the lead frame to the chip, and then encapsulating the chip and portions of the conductors in a suitable insulating material such as an epoxy resin. The portions of the conductors which extend externally of the encapsulating or potting material are then connected to further conductors to connect the encapsulated chip into a circuit.

Usually, solid state devices are incorporated into circuits which are contained on a printed circuit board and the leads which extend from the packaged solid state device are relatively small so that they can be inserted into holes in a printed circuit board and soldered to conductors on the printed circuit board. The electrical connections between the chip and the conductors of the lead frame are commonly made by wires which are bonded to the chip and to the ends of the conductors although some lead frames have been proposed which permit direct bonding of the lead frame to the chip; see, for example, U.S. Pat. Nos. 3,650,232, 3,735,017, and 3,736,367. The lead frames shown in these patents have parallel side-by-side terminal post portions which are dimensioned such that they can be inserted into the holes in a printed circuit board as mentioned above.

Under some circumstances, solid state chips are used in circuits which are not on printed circuit boards but which are rather compressed of conventional insulated wires. For example, there is a trend towards the use of solid state control components in domestic appliances such as washers, dryers, microwave ovens, and conventional ranges. Such appliances require insulated wires for many of their elements, such as the heating units, and the control circuits and the electrical connections required for appliances are achieved by means of conventional harnesses composed of insulated wires having disengageable terminals on their ends. Many, if not most, of the prior art packaging methods for solid state chips can not be readily incorporated into appliance harnesses for the reason, as mentioned above, that the packaging methods result in relatively thin leads in the solid state package which are suitable only for use on printed circuit boards.

The present invention is directed to the achievement of a package for a transistor or the like having relatively massive terminals which can be mated with complementary terminal devices on insulated wires. The invention is further directed to the achievement of a lead frame which can be produced in the form of a continuous strip and which is suitable for use in packaging solid state chips in a way which will result in the completed package having terminals suitable for mating with complementary terminals on wires.

In accordance with a preferred embodiment of the invention, a continuous strip of lead frames comprises a carrier strip having three integral arms extending laterally therefrom for each lead frame. One of the arms has a chip supporting surface and the other two arms have reversely bent portions which extend over this surface so that a chip mounted on the chip supporting surface will be contacted on its underside by the chip supporting surface and on its upper side by the remaining arms. Each of the arms formed has extending therefrom a tab portion which lies in the plane of the strip and which is composed of a double thickness of the metal of the strip. In use, after the chip is mounted on the chip supporting surface, a substrate is provided under the arms and the arms are separated from the carrier strip so that they then provide independent electrical bands to the chip. The arms are then bent through an angle of 90° so that they surround the chip and extend normally of the substrate. Finally, the base portions of the terminal tabs which are adjacent to the heat snk and the chip are encapsulated and enclosed in suitable insulating housing means. The resulting package then has three terminal tabs extending therefrom which can be mated with complementary terminal devices.

It is accordingly an object of the invention to provide an improved lead frame strip in which each lead frame has improved terminal means integral therewith. A further object is to provide an improved finished package for a solid state chip such as a transistor. A still further object is to provide an improved method of packaging solid state chips or the like.

These and other objects of the invention are achieved in preferred embodiments thereof shown in the accompanying drawing in which:

FIG. 4 is a perspective view of the flat blank from which a lead frame in accordance with the invention is formed.

FIG. 5 is a perspective view of the formed lead frame and illustrating the manner of assembling a chip and a substrate to the lead frame.

FIG. 6 is a perspective view of a lead frame in accordance with an alternative embodiment of the invention.

FIG. 7 is a plan view of the blank from which the lead frame of FIG. 6 is formed.

Figure 1:
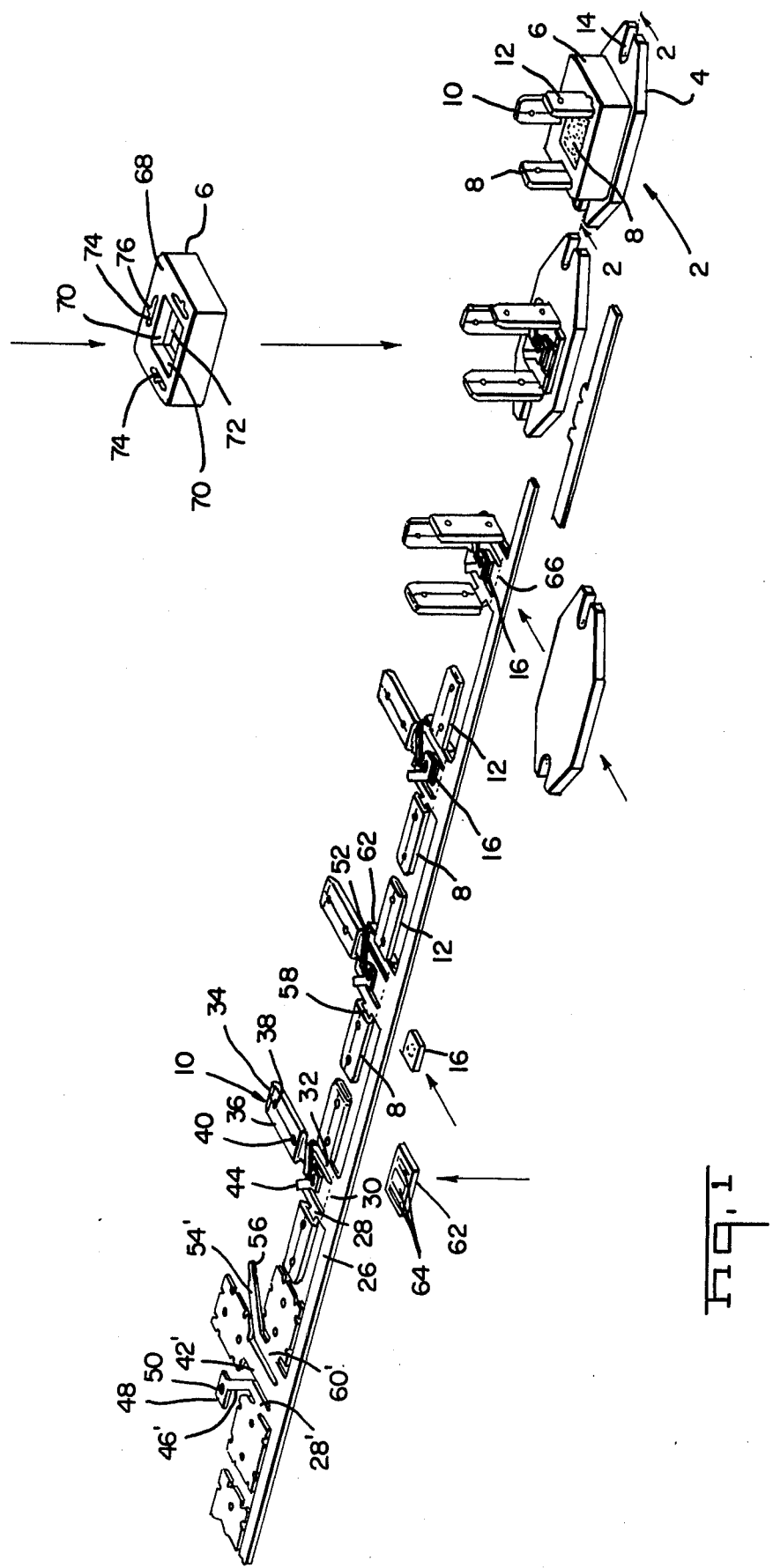
FIG. 1 is a perspective view illustrating the manufacture of lead frame strip in accordance with the invention and the process or method of packaging solid state chips in accordance with the invention.
Figure 2:
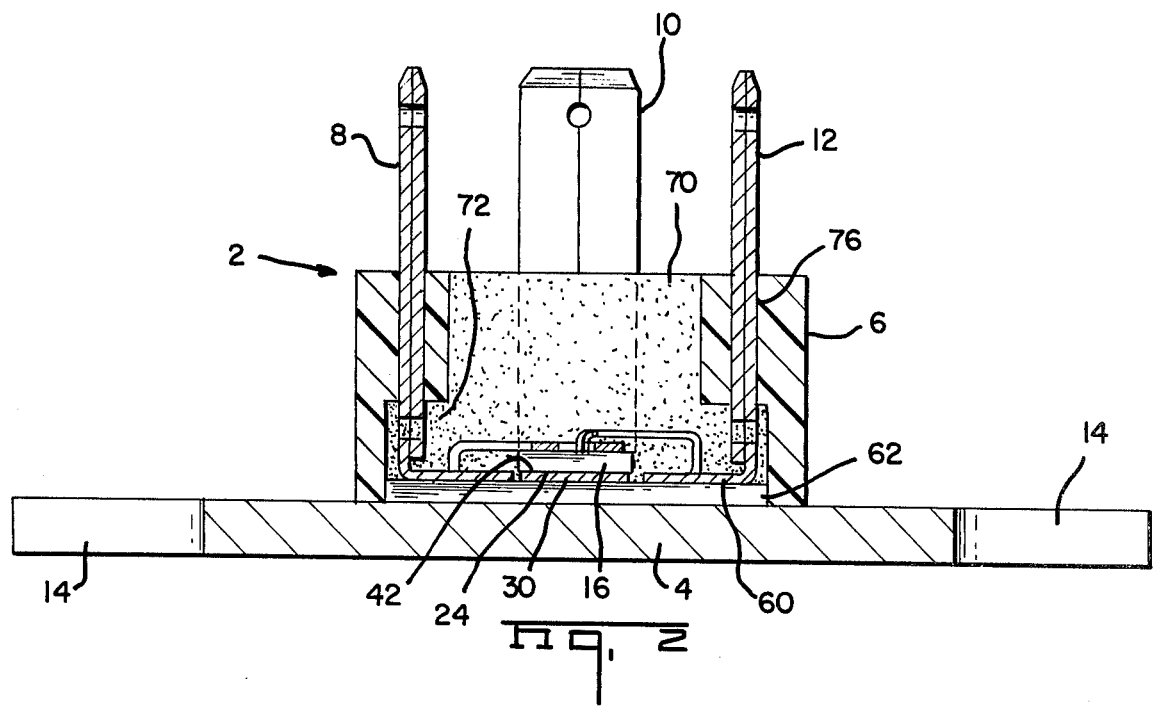
FIG. 2 is a cross sectional view of a package chip taken along the lines 2—2 of FIG. 1.
Figure 3:
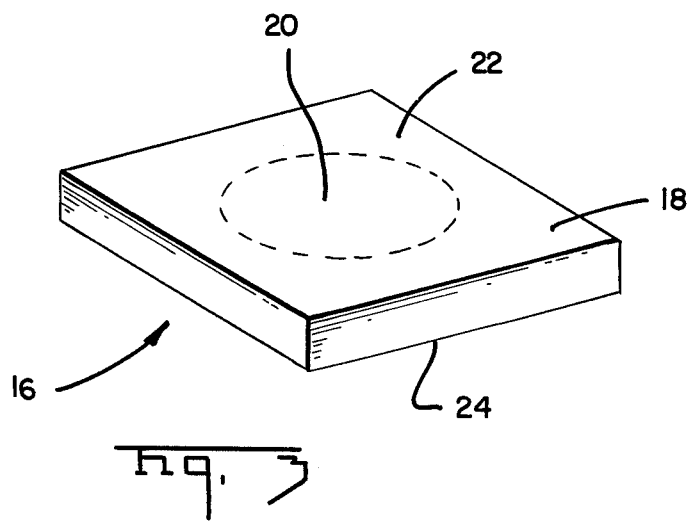
FIG. 3 is a perspective view of a typical chip such as a triac or a transistor.

FIGS. 1 and 2 show a package 2 containing a solid state chip 16 and comprising a relatively massive metallic heat sink 4, a housing and encapsulating assembly 6, and terminal tabs 8, 10, 12 which extend from the upper surface of the housing assembly. The tabs are connected to the chip 16 which is contained in the housing assembly in a manner described below. The chip 16 has an upper surface 18 on which there are two contact areas 20, 22 the contact area 20 being located in the center of the upper surface and the contact area 22 surrounding the contact area 20. The underside 24 of the chip constitutes a third contact area. Notches 14 are provided at each end of the heat sink 4 so that it can be fastened by screws to a panel member or the like.

The finished package 2 is produced by a series of manufacturing and assembly steps which are illustrated in FIG. 1. During these manufacturing steps, the chip, a substrate 62, the heat sink, and the housing assembly are assembled to an individual lead frame of the type shown in FIG. 5. These lead frames are produced in the form of a continuous strip comprising a carrier strip 26 having at spaced-apart intervals first, second, and third arms 28, 30, 32 extending laterally therefrom. The second arm 30, which is between the first and third arms, has a free end 34 which is remote from the carrier strip and the tab portion 10 of this arm comprises two or more thicknesses of the stock metal of the strip folded as shown in FIG. 5 so that its thickness will be that of conventional terminal tabs commonly used in the appliance industry. A hole 38 is provided in the terminal tab 10 adjacent to the free end 34, this hole being intended to receive a detent boss on a complementary terminal when the complementary terminal is mated with the tab. Another hole 40 is provided in the terminal tab adjacent to its inner end to facilitate the encapsulation process as will be described below. The intermediate portion of the second arm 30 is relatively wide as compared to the first and third arms and provides a chip supporting surface 42 which receives the chip as shown in FIG. 5 with the downwardly facing surface 24 of the chip against the surface 42.

The first arm 28 extends partially along, and parallel to, the arm 30 and is reversely bent as shown at 44 so that the end portion 46 of this first arm extends obliquely towards the carrier strip and over the supporting surface 42. The end of the portion 46 is enlarged to provide a contact tip 48 intended for engagement with the peripheral contact area 22 of the chip 16. The enlarged end 48 is provided with a central opening 50 so that the center contact area 20 of the chip is not contacted by this arm.

The third arm 32 is also relatively narrow and extends parallel to the second arm to a point short of the inner end of the terminal tab 10. Arm 32 is reversely bent as shown at 52 so that its end portion 54 also extends diagonally over the chip supporting surface 42. The tip of the arm portion 54 is of reduced width as shown at 56 and is bent downwardly so that it extends through the opening 50 and will contact the center contact area 20 of a chip 16.

The terminal tab 8 extends parallel to the length of the strip and is connected to the arm 28 by a short connecting neck 58. Terminal tab 8, like the tabs 10 and 12, is formed by folding stock metal to produce a double thickness of stock metal. Similarly, the terminal tab 12 also extends parallel to the carrier strip and rightwardly as viewed in FIG. 5 and is also connected to the arm 32 by a short neck section 60. These neck sections permit the arms to be bent upwardly and out of the plane of the strip as shown in FIG. 2. The tabs 8 an 12 have openings 38 and 40 therein as previously described with reference to the tab 10.

During manufacture of the lead frame strip, a continuous strip of suitable conductive metal such as OFHC copper four numbers hard having a thickness of 0.015 is blanked or punched to produce the blank shown in FIG. 4 and the blank is then formed into the final lead frame of FIG. 5 by appropriate folding and bending operations. The parts of the blank of FIG. 4 are identified by the same reference numerals, differentiated by prime marks, as those used to identify the various parts of the finished lead frame and the fold lines and bend lines are indicated by dotted lines in FIG. 4.

In a production process in which packaged chips as shown at 2 are produced, a continuous strip of lead frames is fed through a production line as shown in FIG. 1. At the first station, a substrate 62 of insulating material is assembled to the underside of the central chip receiving zone of the lead frame. This substrate which may be of a thermally conductive electrically insulating material such as BeO has three parallel bands 64 on its upper surface which are metalized, the central band being relatively wider than the two bands adjacent to the ends of the substrate. Metalization is provided in these areas only for the purpose of permitting bonding of the substrate to the underside of the lead frame and the purpose of the substrate is to insulate the lead frame from the metallic heat sink 4. The underside of the substrate can be metalized over its entire surface but the separate bands 64 of metalization are provided on the upper surface so that the three arms of the lead frame which are bonded to these bands will be electrically separate from each other.

After the substrate has been bonded to the undersides of the arms 28, 30, 32 the chip 16 is moved laterally onto the chip supporting surface so that its lower side is against the chip supporting surface and its upper surface is contacted in the areas 20, 22 by the contact tip portions 56, 48 respectively. It will be understood that the chip is conventional provided with a coating of solder so that upon heating the chip will be bonded to the chip supporting surface and to the contact tip portions of the arms. The steps of bonding the substrate to the lead frame and the chip to the lead frame may be carried out separately or they may be carried out simultaneously.

After the bonding operations described above have been completed, the continuous strip is fed to a station at which score lines 66 are provided across the arms adjacent to their inner ends. These score lines extend parallel to the carrier strip and facilitate subsequent removal of the carrier strip from the lead frame. The tabs 8, 10, 12 are bent upwardly so that they extend normally of the plane of the strip and this operation may be carried out contemporaneously with the scoring operation or at an immediately adjacent station on the production line.

A heat sink 4 is fed laterally towards the strip as shown in FIG. 1 and the metalized downwardly facing surface of the substrate is then bonded to the heat sink. The portion of the carrier strip to which the lead frame is attached is then severed along the score lines 66 and removed so that the three arms are now electrically independent of each other. The step of removing the carrier strip can, as desired, be carried out immediately after bonding of the substrate to the arms of the lead frame or the carrier strip can be retained until the heat sink is bonded to the substrate as it is useful for feeding and handling purposes.

Finally, a pre-molded housing 68 is assembled to the upper surface of the heat sink and potting material is flowed into a centrally located well 70 in the housing. The housing 68 has an upper surface and has three rectangular openings 74 extending therethrough from its underside to this upper surface for accommodation of the terminal tabs. Each opening 74 has a narrow channel groove 76 extending along one of its walls so that when the pottng material is poured into the well, an escape vent is provided for entrapped air and the potting material will completely enclose the chip, the arms, and the lower ends of the terminal tabs. As shown in FIG. 2, the well is enlarged at its lower or inner end 74 so that the potting material can surround the lower portions of the tabs and flow into the openings 40 in the tabs. The potting material thus firmly holds the tabs and prevents the transmission of forces applied to the tabs to the electrical connections between the chip and the three arms.

FIG. 1 illustrates the manufacturing steps for producing the completed package 2. It will be understood that it is common practice in the electronics industry to produce the continuous strip of lead frames at one manufacturing site and wind the lead frames onto reels for shipment to another manufacturing site at which the final assembly steps are carried out. Thus the manufacturer of the lead frame strip would supply continuous strip of finished lead frames as shown in FIG. 5 to another manufacturer who would have a production line. The strip of lead frames would be fed from a reel along the production line and the steps of bonding the substrate to the lead frame, assembling and bonding the chip to the lead frame, bending up the tabs so that they extend normally, removing the carrier strip, and assembling the housing potting material to the heat sink would be carried out along this production line.

FIGS. 6 and 7 show an alternative embodiment of a lead frame in accordance with the invention which comprises two spaced-apart carrier strips 78, 80 having spaced-apart ladder strips 82 extending between the carrier strips with one lead frame between adjacent ladder strips. In this embodiment, the first, second, and third arms are shown at 84, 86, 88 respectively.

The first arm is integral with the second arm rather than with a carrier strip and extends from the second arm as shown at 83. The third arm 88 is similarly integral with the second arm as shown at 85 although this arm is connected to the carrier strip 80 as shown at 102 for support purposes. The portion 102 of the lead frame would be removed during the final packaging process.

The second arm has a chip supporting surface 94 which is at the free end of this arm and is spaced from both of the carrier strips. The first arm extends beside the chip supporting surface and is reversely bent as shown at 96. A lateral extension 98 of this arm extends over the surface 94 and has a central opening 100 therein so that it will selectively contact the area 22 of the chip. The third arm has a reversely formed portion 103, 104 which has a reduced diameter end which extends through the opening 100 so that it will contact the central contact area 20 of the chip. This portion 104 of the third arm is formed from a section of the blank which is later folded to provide the tab 112.

The three tabs 108, 110, 112 are integral with the arms as shown and the tabs of the first and third arms extend in the direction of the strip while the tab 110 of the second arm extends laterally of the length of the strip as in the previously described embodiment. The free ends of all of the tabs are secured to the strip, the arms or tabs 108, 112 being integral with ladder strips 82 as shown at 114, 118 while the arm 110 is integral with the carrier strip 78.

The lead frame of FIG. 6 is produced from the blank shown in FIG. 7 and again, the same reference numerals differentiated by prime marks are used to identify corresponding parts in the blank and in the finished formed lead frame. The lead frame of FIG. 7 may be found to be somewhat more sturdy than the lead frame of FIG. 1 and may prove to be advantageous under some circumstances, for example, where the lead frame is formed of extremely thin stock metal and/or rough or abusive handling is expected during subsequent processing of the lead frame.

The embodiments described above provide in the finished package upstanding terminal tabs which surround a chip receiving area in which the ends of the arms are located. It is common practice in the electrical industry for all of the manufacturers to agree to a particular tab location for a package so that the package of different manufacturers is interchangeable. Thus a standard three-position connector having three receptacle terminals therein might be produced for mating with the three tabs of the package 2. The principles of the invention can be followed to produce a finished package in which the tabs would be located in positions other than those shown in FIGS. 1 and 2. For example, the tabs might be arranged at equally spaced intervals of 120° around the chip receiving zone or the center of the package. This configuration can be achieved by suitable layout of the lead frame so that prior to forming, the tabs would extend from the chip receiving surface at equally spaced intervals.

What is claimed is:

1. A continuous strip of stamped and formed lead frames, each lead frame of said strip being intended to receive, and establish electrical connections to, a chip having oppositely directed faces and having two contact areas on one of said faces and having one contact area on the other face, said strip comprising:

a continuous carrier strip means, said lead frames being integral with said carrier strip means at spaced-apart intervals, each of said lead frames having a chip receiving zone which is spaced from said carrier strip means, each of said lead frames comprising first, second, and third arms, said arms being integral with said carrier strip means, each of said arms having an integral terminal portion, each of said terminal portions being generally rectangular and comprising a plurality of thicknesses of sheet metal and being dimensioned to be mated with a complementary terminal device, said terminal portions radiating from said chip receiving zone of each lead frame, said second arm of each lead frame having integral chip supporting surface portions in said chip receiving zone, said first and third arms having contact members which extend at least partially across said chip supporting surface portions, said contact members of said first and third arms having contact tip portions for establishing electrical contact with said two contact areas on said one face of a chip whereby, upon placement of a chip on said chip supporting surface of one of said lead frames with said other face of said chip against said chip supporting surface and with said contact members extending across said one face of said chip, said chip supporting surface will be in electrical contact with said one contact area on said other face of said chip, and said contact tip portions of said contact members will be in electrical contact with said two contact areas on said one face of said chip, and upon severing said one lead frame from said strip and bending said terminal portions away from the plane of said strip in a common direction, said terminal portions will surround said chip receiving zone and external conductors can be connected to said chip by mating terminals in said external conductors with said terminal portions of said arms.

2. A strip as set forth in claim 1, each of said terminal portions comprising a terminal tab having two thicknesses of sheet metal.

3. A strip of stamped and formed lead frames as set forth in claim 1, two of said terminal portions of each of said lead frames extending in opposite directions and generally parallel to the length of said continuous strip, the remaining one of said terminal portions extending transversely of the length of said strip.

4. A strip as set forth in claim 3, said carrier strip means comprising a pair of spaced-apart continuous carrier strips, said lead frames being between said carrier strips.

5. A strip as set forth in claim 4, said carrier strip means further comprising spaced-apart ladder strips extending between, and integral with said spaced-apart carrier strips, each of said lead frames being between two adjacent ladder strips.

6. A strip as set forth in claim 5, two of said terminal portions of each of said lead frames extending in opposite directions and generally parallel to the length of said strip, said two terminal portions being integral with adjacent ladder strips, the third terminal portions extending towards, and being integral with, one of said carrier strips.

7. A continuous strip of stamped and formed lead frames as set forth in claim 1, said carrier strip means comprising at least one continuous carrier strip, said first, second, and third arms extending laterally in side-by-side relationship from said carrier strip, said second arm being between said first and third arms, said second arm having a free end portion which is remote from said carrier strip, said terminal portion of said second arm being at said free end portion, said chip supporting surface portions being between said free end portion and said carrier strip.

8. A continuous strip of stamped and formed lead frames as set forth in claim 1, said first and third arms having reverse bends, said contact members extending from said reverse bends towards said chip supporting surface.

9. A continuous strip of stamped and formed lead frames, each lead frame of said strip being intended to receive and establish electrical connections to a chip having oppositely directed faces and having two active areas on one of said faces and having one active area on the other face, said strip comprising:
a continuous carrier strip, said lead frames being integral with said carrier strip at spaced-apart intervals,
each of said lead frames comprising first, second, and third arms, each of said arms being integral with and extending laterally from one edge of said carrier strip, said arms being in side-by-side relationship, said second arm being between said first and third arms,
said second arm having a free end which is remote from said carrier strip and having a chip supporting zone which is between said free end and said carrier strip, said free end of said second arm having terminal means for engagement with an external conductor,
said first and third arms each being reversely bent at a location spaced from said carrier strip and having free end portions which extend to said chip supporting zone, said free end portions having contact tip portions at said chip supporting zone,
said first and third arm having integral terminal means extending therefrom in opposite directions parallel and proximate to said carrier strip whereby,
upon placement of a chip member in said chip supporting zone of one of said lead frames with said chip between said contact tip portions of said first and third arms and with said one face of said chip member beneath said contact portions of said first and third arms, said second arm will be in electrical contact with said one active area on said other face and said first and third arms will be in electrical contact with said two active areas on said one face; and upon severing said arms from said carrier strip, said arms will be connected to said active areas by independent electrical paths.

10. A continuous strip as set forth in claim 9, said terminal means in said first, second, and third arms comprising folded portions of said sheet metal arms, said terminal means being in the form of tabs which are dimensioned to receive a complementary connecting device.

11. A package comprising a chip having oppositely directed faces, having two contact areas on one of said faces, and having one contact area in the other face, said package comprising:
substrate means, first, second, and third sheet metal arms mounted on said substrate means in parallel side-by-side spaced-apart relationship, said second arm being between said first and third arms,
said second arm having a chip supporting surface on, and extending parallel to, said substrate, said chip being on, and in electrical contact with, said chip supporting surface with said other face of said chip against said chip supporting surface,
said first and third arms having reverse bends therein intermediate their ends and each having a contact member extending from said reverse bends to said one face of said chip, said contact members having contact tip portions on their ends, said contact tip portion of said first arm being in electrical contact with one of said contact areas and said contact tip portion of said third arm being in electrical contact with the other contact area on said one face of said chip,
each of said arms having integral sheet metal terminal portions extending therefrom normally of the plane of said substrate, said terminal portions partially surrounding and forming an enclosure around said chip,
insulating housing means on said substrate in enclosing relationship to said arms and said chip, portions of said terminal members extending through said insulating housing whereby,
said chip can be electrically connected to external conductors by mating said terminal members with complementary terminal members on said external conductors.

12. A package as set forth in claim 11, said sheet metal terminal portions of said arms being folded to provide spaced-apart terminal tabs extending from said insulating housing.

13. A package as set forth in claim 12, said substrate means comprising an insulating substrate which is disposed against, and bonded to, said first, second, and third arms, and a metallic heat sink bonded to said substrate and extending laterally beyond said substrate, portions of said insulating housing means being on said heat sink.

* * * * *